United States Patent
Arifuku et al.

(10) Patent No.: US 8,043,709 B2
(45) Date of Patent: Oct. 25, 2011

(54) CIRCUIT CONNECTING MATERIAL, FILM-LIKE CIRCUIT CONNECTING MATERIAL USING THE SAME, CIRCUIT MEMBER CONNECTING STRUCTURE, AND METHOD OF PRODUCING THE SAME

(75) Inventors: Motohiro Arifuku, Ibaraki (JP); Itsuo Watanabe, Ibaraki (JP); Yasushi Gotou, Ibaraki (JP); Kouji Kobayashi, Ibaraki (JP); Kazuyoshi Kojima, Ibaraki (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 1235 days.

(21) Appl. No.: 10/541,380

(22) PCT Filed: Jun. 24, 2004

(86) PCT No.: PCT/JP2004/008896
§ 371 (c)(1),
(2), (4) Date: Jul. 6, 2005

(87) PCT Pub. No.: WO2005/002002
PCT Pub. Date: Jan. 6, 2005

(65) Prior Publication Data
US 2006/0100314 A1    May 11, 2006

(30) Foreign Application Priority Data
Jun. 25, 2003    (JP) ................ P2003-181593

(51) Int. Cl.
H01R 11/01 (2006.01)
H01B 1/22 (2006.01)
H01L 21/60 (2006.01)
H05K 1/14 (2006.01)
H05K 3/36 (2006.01)
C09J 9/02 (2006.01)

(52) U.S. Cl. ............ 428/450; 428/355 R; 428/356; 428/469; 428/403; 428/213; 252/500; 252/512; 174/259; 174/260; 257/783; 257/784; 156/325; 156/273.9; 156/274.8

(58) Field of Classification Search .......... 252/500, 252/512, 513–514; 428/402, 407, 981, 355 EN, 428/355 AC; 427/207.1; 438/119; 174/259; 29/832
See application file for complete search history.

(56) References Cited

U.S. PATENT DOCUMENTS
5,065,505 A * 11/1991 Matsubara et al. ............ 29/830
(Continued)

FOREIGN PATENT DOCUMENTS
CN    100380741    4/2008
(Continued)

OTHER PUBLICATIONS
Supplementary European Search Report, for Application No. EP 04 74 6365, dated Jan. 31, 2006.
(Continued)

*Primary Examiner* — Stanley Silverman
*Assistant Examiner* — Kallambella Vijayakumar
(74) *Attorney, Agent, or Firm* — Antonelli, Terry, Stout & Kraus, LLP.

(57) ABSTRACT

The present invention is a circuit connecting material used for the mutual connection of a circuit member in which electrodes and insulating layers are formed adjacent to each other on the surface of a board, and a circuit member in which electrodes and insulating layers are formed adjacent to each other on the surface of a board, with the edge parts and of the insulating layers being formed with a greater thickness than the electrodes on the basis of the main surfaces, wherein this circuit connecting material contains a bonding agent composition and conductive particles that have a mean particle size of 1 μm or greater but less than 10 μm and a hardness of 1.961 to 6.865 GPa, and this circuit connecting material exhibits a storage elastic modulus of 0.5 to 3 GPa at 40° C. and a mean coefficient of thermal expansion of 30 to 200 ppm/° C. at from 25° C. to 100° C. when subjected to the curing treatment.

13 Claims, 7 Drawing Sheets

U.S. PATENT DOCUMENTS

| | | | |
|---|---|---|---|
| 5,162,087 A * | 11/1992 | Fukuzawa et al. | 252/500 |
| 5,330,684 A * | 7/1994 | Emori et al. | 252/512 |
| 6,338,195 B1 * | 1/2002 | Tsukagoshi et al. | 29/832 |
| 6,344,156 B1 | 2/2002 | Yamada et al. | |
| 2002/0034620 A1 | 3/2002 | Takezawa et al. | |
| 2004/0266913 A1 * | 12/2004 | Yamaguchi et al. | 523/176 |

FOREIGN PATENT DOCUMENTS

| | | |
|---|---|---|
| EP | 0 979 854 | 2/2000 |
| EP | 0 996 321 | 4/2000 |
| EP | 1 085 790 | 3/2001 |
| EP | 1628363 A1 | 1/2006 |
| JP | 59-120436 | 7/1984 |
| JP | 60-191228 | 9/1985 |
| JP | 1-251787 | 10/1989 |
| JP | 4-30542 | 2/1992 |
| JP | 07-5487 | 1/1995 |
| JP | 7-90237 | 4/1995 |
| JP | 8-293526 | 11/1996 |
| JP | 09-199206 | 7/1997 |
| JP | 09-329796 | 12/1997 |
| JP | 10-199930 | 7/1998 |
| JP | 11-329069 | 11/1999 |
| JP | 2000-40418 | 2/2000 |
| JP | 2000-208178 * | 7/2000 |
| JP | 2001-160568 | 6/2001 |
| JP | 2001-164210 | 6/2001 |
| JP | 2001-189171 | 7/2001 |
| JP | 2001-283637 * | 10/2001 |
| JP | 2002-184811 | 6/2002 |
| JP | 3371894 | 11/2002 |
| TW | 502353 | 9/2002 |
| TW | 525252 | 3/2003 |
| TW | 200304935 A | 10/2003 |
| WO | WO 03/02249 A1 * | 3/2003 |

OTHER PUBLICATIONS

Translation of International Preliminary Report on Patentability (Form PFT/IB/338), for Application No. PCT/JP2004/008896, mailed Mar. 30, 2006.

Chinese Official Action issued on Mar. 6, 2009, in Chinese Application No. 2008100804233.

Japanese Official Action issued Oct. 28, 2008, in Application No. 2005-511036.

Publication, MPA-5000, Mirror Projection Mask Aligner (Canon), 1996, pp. 59-64.

Publication, Hitachi Chemical Technical Report, 33, p. 38, 1999.

Publication, Hitachi Chemical Technical Report, 36, p. 44, 2001.

Taiwanese Official Action issued Nov. 23, 2009, for Application No. 093118679.

*Dictionary of Semiconductor Technology & Industry* (Dec. 1999), pp. 1291-1292.

*Epoxy Resin Handbook* (Dec. 1987), p. 370.

"Conductive Microparticles Micropearl AU Technical Reference", Sekisui, Jan. 1995, pp. 52-69.

* cited by examiner (a)

(b)

CIRCUIT CONNECTING MATERIAL, FILM-LIKE CIRCUIT CONNECTING MATERIAL USING THE SAME, CIRCUIT MEMBER CONNECTING STRUCTURE, AND METHOD OF PRODUCING THE SAME

TECHNICAL FIELD

The present invention relates to a circuit connecting material, a film-form circuit connecting material using this circuit connecting material, a circuit member connecting structure and a method of manufacturing this circuit connecting structure.

BACKGROUND ART

Circuit member connecting structures used for the mutual connection of circuit members such as liquid crystal displays and TCPs (tape carrier packages), FPCs (flexible printed circuits) and TCPs, FPCs and printed wiring boards or the like have been known in the past. Circuit connecting materials in which conductive particles are dispersed in a bonding agent (e.g., anisotropic conductive bonding agents) are used for the connection of such circuit members to each other (for example, see Japanese Patent Application Laid-Open No. 59-120436, Japanese Patent Application Laid-Open No. 60-191228, Japanese Patent Application Laid-Open No. 1-251787, Japanese Patent Application Laid-Open No. 7-90237 and Japanese Patent Application Laid-Open No. 2001-189171).

Meanwhile, circuits have shown progressively higher densities as electronic devices have become smaller and thinner in recent years, so that the spacing between circuit electrodes and the width of circuit electrodes in circuit members have become extremely narrow; consequently, it has become difficult to ensure high insulating properties between circuit electrodes. Accordingly, in order to ensure high insulating properties between the circuit electrodes in circuit members, it is considered necessary to form an insulating layer comprising an organic insulating substance, silicon dioxide, silicon nitride or the like between the circuit electrodes.

FIG. 7 is a sectional view which shows a conventional example of a connecting structure for circuit members. As is shown in FIG. 7, the circuit member connecting structure 100 comprises a first circuit member 131 and a second circuit member 141; this first circuit member 131 and second circuit member 141 are connected by a circuit connecting member 150. The first circuit member 131 is constructed from a circuit board 132, and circuit electrodes 133 and insulating layers 134 that are formed adjacent to each other on one surface 132a of this circuit board 132. Portions of the insulating layers 134 have a shape that rides over the edges of the circuit electrodes 133. Specifically, portions of the insulating layers 134 are formed with a greater thickness than the circuit electrodes 133 on the basis of the surface 132a of the circuit board 132. Furthermore, the second circuit member 141 has a construction similar to that of the first circuit member 131; this second circuit member 141 is constructed from a circuit board 142, and circuit electrodes 143 and insulating layers 144 that are formed adjacent to each other on one surface 142a of this circuit board 142, and portions of the insulating layers 144 have a shape that rides over the edges of the circuit electrodes 143. Meanwhile, the circuit connecting member 150 is a member in which, for example, conductive particles 152 produced by forming a nickel plating layer on the surfaces of benzoguanamine resin particles are disposed in an insulating substance 151. Here, for example, the mean particle size of the conductive particles is 5 μm, and the hardness (K value) is 7490 N/mm².

DISCLOSURE OF THE INVENTION

However, the abovementioned conventional circuit member connecting structure 100 has suffered from the following problems.

Specifically, in the circuit member connecting structure 100 shown in FIG. 7, the following problem has been encountered: namely, the connection resistance between the facing circuit electrodes 133 and 143 is large, and the long-term reliability of the electrical characteristics is insufficient.

The present invention was devised in light of the above facts; it is an object of the present invention to provide a circuit connecting material that can sufficiently reduce the connection resistance between facing circuit electrodes, and that is superior in terms of the long-term reliability of electrical characteristics, a film-form circuit connecting material using this circuit connecting material, a circuit member connecting structure and a method of manufacturing this circuit member connecting structure.

The present inventors conducted diligent research in order to solve the abovementioned problems; as a result of this research, the inventors discovered that the cause of the abovementioned problems is to be found especially in the hardness of the conductive particles. Specifically, the present inventors discovered that if the hardness of the conductive particles is excessively large, the conductive particles become caught between the insulating films that ride over the edges of the circuit electrodes, so that the conductive particles do not make sufficient contact with both of the facing circuit electrodes 133, and 143, and that as a result of this, the connection resistance between the facing circuit electrodes 133 and 143 is increased. Furthermore, as a result of further diligent research that was conducted in an attempt to solve the abovementioned problems based on the supposition that portions of the insulating films have a shape that rides over the edges of the circuit electrodes in the circuit members, the inventors discovered that the abovementioned problems can be solved by using a circuit connecting material in which the storage elasticity at 40° C. and the mean coefficient of thermal expansion from 25 to 100° C. are in specified ranges as a result of a curing treatment. This discovery led to the perfection of the present invention.

Specifically, the present invention is a circuit connecting material which is used to connect a first circuit member in which first circuit electrodes and first insulating layers are formed adjacent to each other on the main surface of a first circuit board, and a second circuit member in which second circuit electrodes and second insulating layers are formed adjacent to each other on the main surface of a second circuit board, with at least some of the insulating layers being formed so that these layers are thicker than the circuit electrodes on the basis of the main surface in at least one of the circuit members, i.e., the first circuit member or second circuit member, wherein this material contains a bonding agent composition and conductive particles that have a mean particle size of 1 μm or greater but less than 10 μm, and a hardness of 1.961 to 6.865 GPa, the storage elastic modulus at 40° C. is 0.5 to 3 GPa as a result of the curing treatment, and the mean coefficient of thermal expansion from 25° C. to 100° C. is 30 to 200 ppm/° C. as a result of the curing treatment.

In this circuit connecting material, when the material is interposed between the first and second circuit members, and a curing treatment is performed by applying heat and pressure via the first and second circuit members, the connection resistance between the facing circuit electrodes can be sufficiently reduced. Furthermore, a structure that is superior in terms of the long-term reliability of the electrical characteristics can be provided.

It is thought that the sufficient reduction of the connection resistance between the circuit electrodes as described above is due to the fact that even if conductive particles become caught between the insulating layers and the circuit electrodes facing these insulating layers, or between the insulating layers that face each other, when the circuit members are connected to each other, the conductive particles are appropriately flattened, so that the distance between the facing circuit electrodes can be sufficiently reduced. Furthermore, it is thought that the superior long-term reliability of the electrical characteristics between the facing circuit electrodes is due to the fact that the first circuit member and second circuit member are firmly connected by the curing treatment of the circuit connecting material, so that variation in the distance between the first circuit electrodes and second circuit electrodes over time can be sufficiently reduced.

Furthermore, the present invention is a film-form circuit connecting material in which the abovementioned circuit connecting material is formed into the shape of a film.

This film-form circuit connecting material has the shape of a film, and is easy to handle. Accordingly, when a first circuit member and second circuit member are connected using this film-form circuit connecting material, the material can easily be interposed between the circuit members, so that the work of connecting the first circuit member and second circuit member is facilitated.

Furthermore, the present invention is circuit member connecting structure which comprises a first circuit member in which first circuit electrodes and first insulating layers are formed adjacent to each other on the main surface of a first circuit board, a second circuit member in which second circuit electrodes and second insulating layers are formed adjacent to each other on the main surface of a second circuit board, and a circuit connecting member which is disposed between the main surface of the first circuit member and the main surface of the second circuit member, and which connects the first and second circuit members to each other, and in which at least some of the insulating layers are formed so that these layers are thicker than the circuit electrodes on the basis of the main surface of the circuit board in at least one of the circuit members, i.e., the first circuit member or second circuit member, wherein the circuit connecting member contains an insulating substance and conductive particles that have a mean particle size of 1 μm or greater but less than 10 μm, and a hardness of 1.961 to 6.865 GPa, the storage elastic module of the circuit connecting member at 40° C. is 0.5 to 3 GPa, the mean coefficient of thermal expansion of this member from 25° C. to 100° C. is 30 to 200 ppm/° C., and the first circuit electrodes and second circuit electrodes are electrically connected via the conductive particles.

In the case of this circuit member connecting structure, the first circuit electrodes and second circuit electrodes are electrically connected via conductive particles; accordingly, the connection resistance between the first and second circuit electrodes can be sufficiently reduced. Furthermore, this circuit member connecting structure is superior in terms of the long-term reliability of the electrical characteristics.

Furthermore, the present invention is a method for manufacturing a circuit member connecting structure which comprises a first circuit member in which first circuit electrodes and first insulating layers are formed adjacent to each other on the main surface of a first circuit board, a second circuit member in which second circuit electrodes and second insulating layers are formed adjacent to each other on the main surface of a second circuit board, and a circuit connecting member which is disposed between the main surface of the first circuit member and the main surface of the second circuit member, and which connects the first and second circuit members to each other, and in which at least some of the insulating layers are formed so that these layers are thicker than the circuit electrodes on the basis of the main surface of the circuit board in at least one of the circuit members, i.e., the first circuit member or second circuit member, wherein the abovementioned film-form circuit connecting material is interposed between the main surface of the first circuit board and the main surface of the second circuit board, and the first circuit member and second circuit member are connected by curing the circuit connecting material by the application of heat and pressure via the first and second circuit members, so that the first circuit electrodes and second circuit electrodes are electrically connected via the conductive particles.

In this method for manufacturing a circuit member connecting structure, when the abovementioned circuit connecting material is interposed between the first circuit member and second circuit member and is subjected to a curing treatment by the application of heat and pressure via the first and second circuit members, the connection resistance between the facing circuit electrodes can be sufficiently reduced, and a circuit member connecting structure that is superior in terms of the long-term reliability of the electrical characteristics can be obtained.

The reason that a circuit member connecting structure in which the connection resistance between the facing circuit electrodes can be sufficiently reduced is obtained is thought to be as follows: namely, even if conductive particles become caught between the insulating layers and the facing circuit electrodes, or between insulating layers that face each other, when the circuit members are connected to each other, the conductive particles are appropriately flattened, so that the distance between the facing circuit electrodes can be sufficiently reduced. Furthermore, the reason that a circuit member connecting structure that is superior in terms of the long-term reliability of the electrical characteristics between the facing circuit electrodes is obtained is thought to be as follows: namely, the first circuit member and second circuit member are firmly connected by the curing treatment of the circuit connecting material, so that variation in the distance between the first circuit electrodes and second circuit electrodes over time can be sufficiently reduced.

The use of the circuit connecting material, circuit member connecting structure and circuit member connecting structure manufacturing method of the present invention makes it possible to achieve a sufficient reduction in the connection resistance between facing circuit electrodes when facing circuit members are connected to each other.

Furthermore, if the film-form circuit connecting material of the present invention is used, the following effect is obtained in addition to the abovementioned effects: namely, this film-form circuit connecting material can easily be interposed between the first circuit member and second circuit member when these circuit members are connected, so that the work of connecting the first circuit member and second circuit member can easily be performed.

BEST MODES FOR CARRYING OUT THE INVENTION

Preferred embodiments of the present invention will be described below with reference to the attached figures. Furthermore, the same symbols are used for the same elements, and redundant descriptions are omitted.

[Embodiment of Circuit Member Connecting Structure]

First, the circuit member connecting structure of the present invention will be described.

Figure 1:
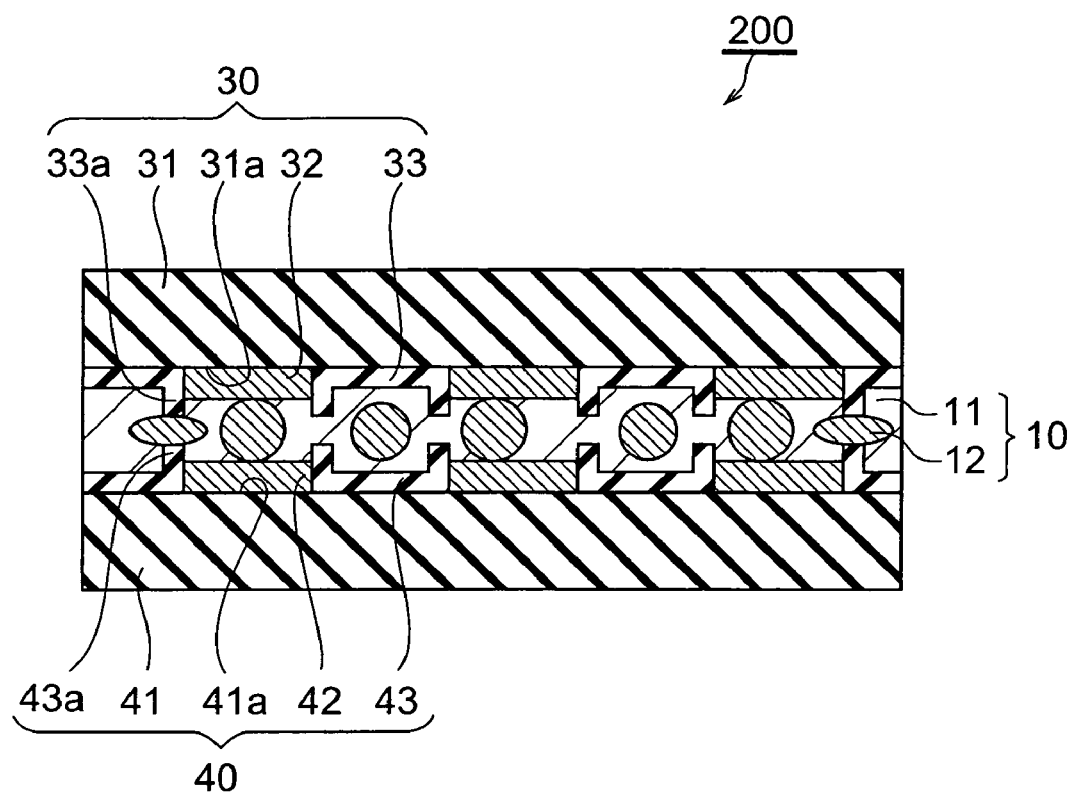
FIG. 1 is a schematic sectional view which shows one embodiment of the circuit member connecting structure of the present invention.
Figure 2:
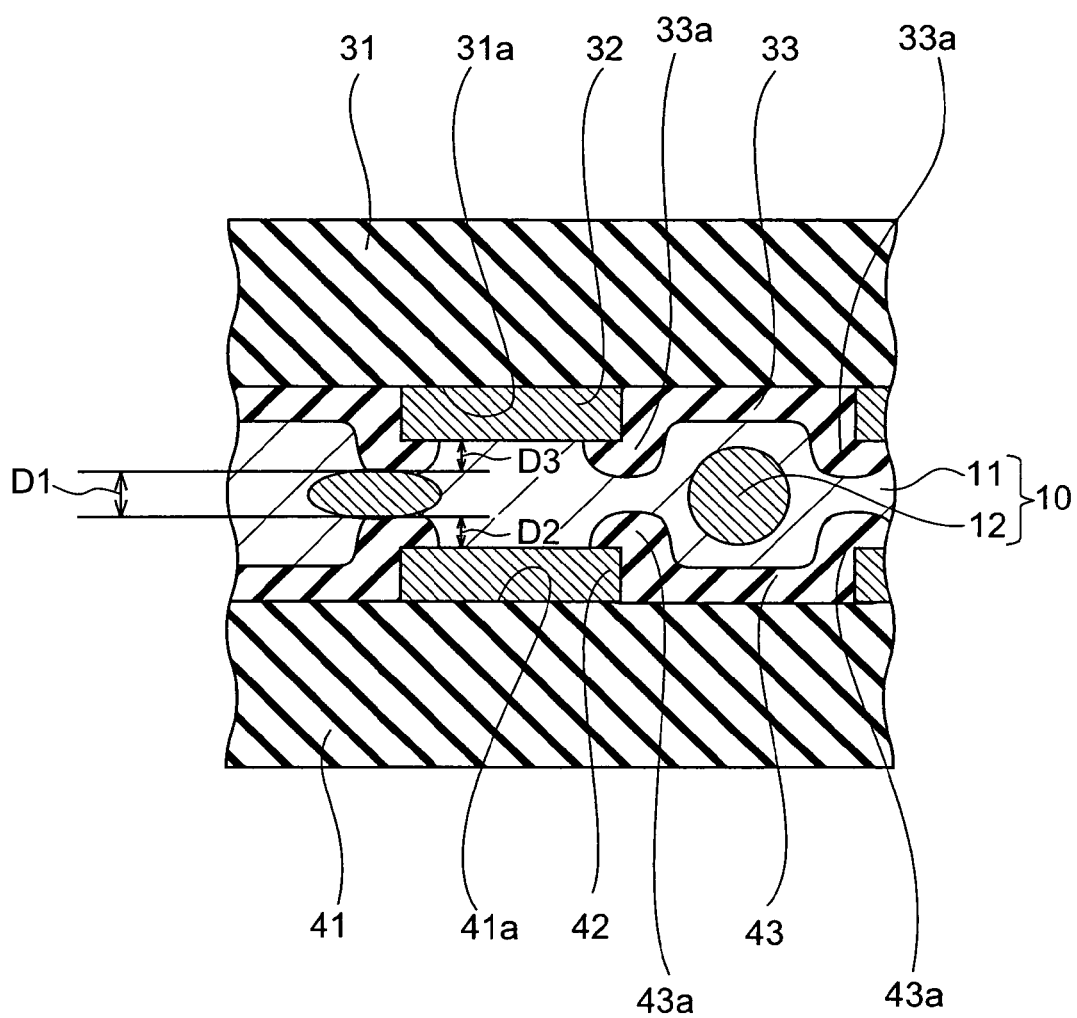
FIG. 2 is a partial enlarged sectional view of FIG. 1.

FIG. 1 is a schematic sectional view which shows a first embodiment of the circuit member connecting structure of the present invention, and FIG. 2 is a partial enlarged sectional view of FIG. 1. As is shown in FIGS. 1 and 2, the circuit member connecting structure 200 of the present embodiment comprises a first circuit member 30 and second circuit member 40 that face each other, and a circuit connecting member 10 that connects this first circuit member 30 and second circuit member 40 is disposed between these circuit members.

The first circuit member 30 comprises a circuit board (first circuit board) 31, circuit electrodes (first circuit electrodes) 32 that are formed on the main surface 31a of the circuit board 31, and insulating layers (first insulating layers) 33 that are formed on the main surface 31a of the circuit board 31. The circuit electrodes 32 and insulating layers 33 are alternately formed adjacent to each other on the circuit board 31. Here, both edge parts 33a of the insulating layers 33 are in a state in which these edge parts ride over the edges of the circuit electrodes 32. Specifically, both edge parts 33a of the insulating layers 33 are formed so that these edge parts 33a are thicker than the central parts of the circuit electrodes 32 on the basis of the main surface 31a of the circuit board 31. In this case, furthermore, the "thickness" of the edge parts 33a of the insulating layers 33 refers to the distance from the main surface 31a of the circuit board 31 to the surfaces of the edge parts 33a of the insulating layers 33.

Meanwhile, the second circuit member 40 comprises a circuit board 41, circuit electrodes (second circuit electrodes) 42 that are formed on the main surface 41a of the circuit board 41, and insulating layers (second insulating layers) 43 that are formed on the main surface 41a of the circuit board 41. Furthermore, as in the case of the first circuit member 30, both edge parts 43a of the insulating layers 43 ride over the edges of the circuit electrodes 42, and these edge parts 43a are formed so that these edge parts are thicker than the circuit electrodes 42 on the basis of the main surface 41a of the circuit board 41.

Furthermore, in a state in which the first circuit member 30 and second circuit member 40 face each other, the gap between the edge parts 33a of the insulating layers 33 and the edge parts 43a of the insulating layers 43 is narrower than the gap between the circuit electrodes 32 and the circuit electrodes 42.

Furthermore, in the circuit connecting member 10, the storage elastic module at 40° C. of the material that constitutes this member is 0.5 to 3 GPa, and the mean coefficient of thermal expansion from 25° C. to 100° C. is 30 to 200 ppm/° C. The circuit connecting member 10 contains an insulating substance 11 and conductive particles 12, and the conductive particles 12 have a mean particle size of 1 μm or greater but less than 10 μm, and a hardness of 1.961 to 6.865 GPa.

In this circuit member connecting structure 200, the circuit electrodes 32 and 42 are electrically connected via the conductive particles 12. Specifically, the conductive particles 12 directly contact both of the circuit electrodes 32 and 42. Furthermore, in cases where conductive particles 12 are caught between the edge parts 33a of the insulating layers 33 and the edge parts 43a of the insulating layers 43, the conductive particles 12 assume a flattened state so that these particles do not hinder the electrical connection between the circuit electrodes 32 and 42.

In this circuit member connecting structure 200, as was described above, the facing circuit electrodes 32 and circuit electrodes 42 are electrically connected via the conductive particles 12. As a result, the connection resistance between the circuit electrodes 32 and 42 is sufficiently reduced. Accordingly, the flow of current between the circuit electrodes 32 and 42 can be smoothly accomplished, so that the functions of the circuits can be sufficiently manifested. Furthermore, as a result of the circuit connecting member 10 being constructed as described above, a high bonding strength can be realized by the relaxation of stress in the interfaces between the circuit members 30 and 40 and the circuit connecting member 10; moreover, this state can be maintained over a long period of time. Specifically, variation in the distance between the circuit electrodes 32 and 42 over time is sufficiently prevented, so that the long-term reliability of the electrical characteristics between the circuit electrodes 32 and 42 can be increased.

Here, the reason that connection resistance between the circuit electrodes 32 and 42 can be sufficiently reduced as a result of conductive particles 12 having hardness in the abovementioned range being contained in the circuit connecting member 10 will be described in detail.

First, since an insulating substance 11 is contained in the circuit connecting member 10, it is necessary for the conductive particles 12 to contact both of the circuit electrodes 32 and 42 in order to achieve a sufficient reduction in the connection resistance between the circuit electrodes 32 and 42. In order to ensure that the conductive particles 12 contact both of the circuit electrodes 32 and 42, the particle size A of the conductive particles 12 that are not flattened, the distance D1 between the edge parts 43a of the insulating layers 43 and the edge parts 33a of the facing insulating layers 33, the difference D3 between the thickness of the circuit electrodes 32 and the thickness of the edge parts 33a of the insulating layers 33 and the difference D2 between the thickness of the circuit electrodes 42 and the thickness of the edge parts 43a of the insulating layers 43 must satisfy the conditions of the following Equation (1).

$$D1+D2+D3 \leq A \qquad (1)$$

Specifically, the distance D1 between the edge parts 33a of the insulating layers 33 and the edge part 43a of the insulating layers 43 must satisfy the conditions of the following Equation (2).

$$D1 \leq A-D2-D3 \qquad (2)$$

Here, if the conductive particles have an extremely high hardness that exceeds 6.865 GPa, then the conductive particles will not be flattened in cases where, for example, such conductive particles become caught between the edge parts 33a of the insulating layers 33 of the circuit member 30 and the edge parts 43a of the insulating layers 43 of the circuit member 40, so that the distance D1 between the edge parts 33a of the insulating layers 33 and the edge parts 43a of the insulating layers 43 of the second circuit member 40 cannot be sufficiently reduced. As a result, D1 does not satisfy the abovementioned Equation (2). Specifically, the distance (D1+D2+D3) between the circuit electrodes 32 and 42 is greater than the particle size A of the conductive particles 12. As a result, the conductive particles between the circuit electrodes 32 and 42 cannot contact both of the circuit electrodes 32 and 42, so that the connection resistance between the circuit electrodes 32 and 42 increases.

On the other hand, if the conductive particles 12 have a hardness of 1.961 to 6.865 GPa, then these conductive particles 12 are flattened in cases where, for example, such conductive particles 12 become caught between the edge parts 33a of the insulating layers 33 and the edge parts 43a of the insulating layers 43. Accordingly, the abovementioned D1 satisfies the conditions of the abovementioned Equation (2), so that the conductive particles 12 contact both of the circuit electrodes 32 and 42, and the connection resistance between the circuit electrodes 32 and 42 is sufficiently reduced.

Furthermore, in cases where the storage elastic modulus (at 40° C. following curing) of the material that constitutes the abovementioned circuit connecting member 10 is less than 0.5 GPa, the bonding strength is insufficient. On the other hand, if this storage elastic modulus exceeds 3 GPa, the connection resistance in the connecting parts increases as a result of internal stress, and the bonding agent may peel away. Furthermore, in cases where the abovementioned mean coefficient of thermal expansion is less than 30 ppm/° C., the bonding strength is insufficient, and if this mean coefficient of thermal expansion exceeds 200 ppm/° C., the connection resistance in the connecting parts increases as a result of internal stress, and the bonding agent may peel away.

Furthermore, in cases where the hardness of the conductive particles 12 exceeds 6.865 GPa, the conductive particles 12 are not sufficiently flattened; accordingly, the contact area between the conductive particles 12 and the circuit electrodes 32 and 42 decreases so that the connection resistance rises, and the electrical connections between the facing circuit electrodes 32 and 42 cannot be sufficiently ensured. On the other hand, in cases where this hardness is less than 1.961 GPa, the conductive particles 12 cannot conform to fluctuations in the gaps between the circuit electrodes 32 and 42 that occur in the case of high temperature and high humidity; accordingly, the connection resistance between the circuit electrodes 32 and 42 cannot be sufficiently reduced.

Furthermore, in cases where the conductive particles 12 are plated, the hardness of the conductive particles 12 can be determined by the following Equation (3) from the applied load P (MPa, Kgf) when the conductive particles are deformed by 10% from the diameter of the conductive particles, the radius r (mm) of the conductive particles and the displacement Δ (mm) as observed during compression of the plated conductive particles using a microscopic compression test device (manufactured by Shimazu Seisakusho K.K.):

$$\text{Conductive particle hardness} = (3/\sqrt{2}) \times P \times \Delta^{(-3/2)} \times r^{(-1/2)} \quad (3)$$

Furthermore, in cases where the mean particle size of the conductive particles 12 is less than 1 μm, the conductive particles are too small, so that these conductive particles cannot contact both of the circuit electrodes; consequently, the electrical connections cannot be sufficiently ensured. On the other hand, if this mean particle size exceeds 10 μm, application to circuit members that have high-density circuits becomes difficult.

Figure 3:
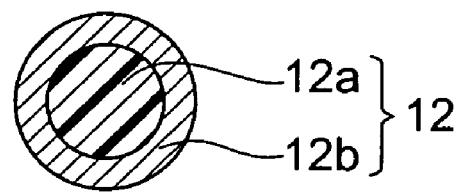
FIG. 3 is a sectional view which shows various configurations of the conductive particles shown in FIG. 1.
Figure 3:
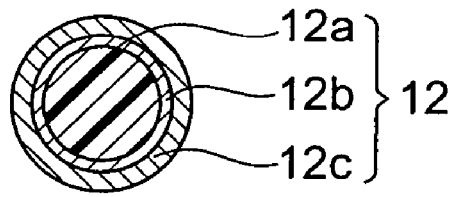

Next, the construction of the conductive particles 12 will be described in detail. In FIG. 3, (a) and (b) are sectional views showing various configurations of the conductive particles 12. As is shown in FIG. 3-(a), the conductive particles 12 may be constructed from a core body 12a made of an organic polymer and a metal layer 12b that is formed on this core body 12. In the case of conductive particles 12 having such a configuration, the hardness of the conductive particles 12 is governed substantially by the hardness of the core body 12b. Furthermore, the hardness of the core body 12a depends on the structure, distance between crosslinking points, degree of crosslinking and the like of the organic polymer that constitutes the material of the core body 12b. Accordingly, the hardness of the conductive particles 12 can be adjusted to the abovementioned range by appropriately selecting elements such as the material, structure and the like of the organic polymer described below.

Examples of organic polymers that can be use to constitute the core body 12a include acrylic resins, styrene resins, benzoguanamine resins, silicone resins, polybutadiene resins and the like. Furthermore, the organic polymers may also be copolymers having a structure in which two or more repeating units based on the monomers that constitute the abovementioned resins are arbitrarily combined. In this case, copolymers obtained by copolymerizing two or more monomers selected from a set comprising benzoguanamine, acrylic acid esters, diallyl phthalate, tetramethylolmethane tetraacrylate, divinylbenzene and styrene are desirable, and copolymers obtained by combining tetramethylolmethane tetraacrylate, divinylbenzene and styrene are even more desirable.

Among these compounds, benzoguanamine and the like have a rigid structure within the molecule, and the distance between crosslinking points is also short; accordingly, as the content of such particles in the copolymer is increased, harder conductive particles 12 are obtained. Furthermore, harder conductive particles 12 can also be obtained by increasing the degree of crosslinking of the organic polymer.

Meanwhile, in the case of acrylic acid esters, diallyl phthalate and the like, the distance between crosslinking points is long; accordingly, as the content of repeating units based on such molecules is increased in the copolymer, softer conductive particles 12 are obtained. Furthermore, softer conductive particles 12 can also be obtained by lowering the degree of crosslinking.

Thus, conductive particles 12 which have hardness in the abovementioned range can be obtained by appropriately selecting the organic polymer that constitutes the core body 12b, and the distance between crosslinking points and crosslinking density of this polymer.

The metal layer 12b that is formed on the core body 12a is constructed from, for example, copper, nickel, a nickel alloy, silver or a silver alloy. The metal layer 12b can be formed by plating the core body 12a with such metals using an electroless plating method. Here, nickel alloys include various types of alloys obtained by means of additive that are added mixed with the plating bath. Well-known alloys of this type include alloys such as nickel-phosphorus, nickel-boron and the like. Furthermore, similar combinations also exist in the case of other alloys. The thickness of the metal layer 12b (plating thickness) is preferably 50 nm to 170 nm, and is even more preferably 50 nm to 150 nm. If this thickness is less than 50 nm, plating defects (peeling) and the like occur so that the connection resistance tends to increase. On the other hand, if this thickness exceeds 170 nm, the conductive particles 12 tend to aggregate, so that short-circuiting may occur between adjacent circuit electrodes.

Furthermore, the conductive particles 12 may further comprise an outermost layer 12c on top of the metal layer 12b as shown in FIG. 3-(b). This outermost layer 12c may be constructed from gold or palladium; these metals can be formed by substitution plating on the metal layer 12b. As a result of the formation of such an outermost layer 12c, an even more favorable connection resistance can be achieved between the circuit electrodes 32 and 42. Specifically, the connection resistance can be sufficiently reduced. It is desirable that the thickness of the outermost layer 12c be 15 to 70 nm. In cases where this thickness is less than 15 nm, it tends to become difficult to obtain a sufficient effect because of plating defects. On the other hand, in cases where this thickness exceeds 70 nm, a favorable connection resistance can be obtained; however, since the amount of plating solution used increases geometrically, the manufacturing cost tends to be greatly increased. Furthermore, in cases where such an outermost layer 12c is formed, it is desirable that the film thickness of the metal layer 12b be 70 to 170 nm. In cases where this film thickness is less than 70 nm, plating defects (peeling) and the like occur so that the connection resistance tends to increase; on the other hand, if this thickness exceeds 170 nm, short-circuiting tends to occur between adjacent circuit electrodes.

Furthermore, in the abovementioned circuit member connecting structure 200, the effect in reducing the connection resistance between the facing circuit electrodes 32 and 42 is especially conspicuous in cases where the difference D3 between the thickness of the edge parts 33a of the insulating layers 33 and the thickness of the central parts of the circuit electrodes 32 in the first circuit member 30 is 50 to 600 nm, an the difference D2 between the thickness of the edge parts 43a of the insulating layers 43 and the thickness of the circuit electrodes 42 in the second circuit member 40 is 50 to 600 nm.

There are no particular restrictions on the insulating layers 33 and 43 as long as these layers are constructed from an insulating material. Ordinarily, however, these insulating layers are constructed from an organic insulating substance, silicon dioxide or silicon nitride. Furthermore, the circuit electrodes 32 and 42 are ordinarily constructed in their entirety from gold, silver, tin, a metal of the platinum group or ITO (indium tin oxide). However, it would also be possible to construct only the surfaces of the circuit electrodes 32 and 42 from such substances. Furthermore, there are no particular restrictions on the material of the circuit boards 31 and 41; typically, however, this material is an organic insulating substance, glass or silicon.

In the abovementioned circuit member connecting structure 200, a favorable connection resistance can be achieved even in cases where the respective areas of the circuit electrodes 32 and 42 in the first and second circuit members 30 and 40 are 15,000 $\mu m^2$ or less. Furthermore, an even more favorable connection resistance can be achieved in cases where the mean number of conductive particles between the facing circuit electrodes 32 and 42 is 3 or greater. Here, the term "mean number of conductive particles" refers to the mean number of conductive particles per electrode. In this case, the connection resistance between the facing circuit electrodes 32 and 42 can be sufficiently reduced. Furthermore, an even more favorable connection resistance can be achieved in cases where the mean number of conductive particles is 6 or greater. The reason for this is that the connection resistance between the facing circuit electrodes 32 and 42 is sufficiently lowered. Furthermore, in cases where the mean number of conductive particles between the circuit electrodes 32 and 42 is 2 or less, the connection resistance becomes excessively high, so that there is a danger that the circuit electrodes will become unable to operate normally.

Furthermore, in the abovementioned circuit member connecting structure 200, it is desirable that the glass transition temperature of the circuit connecting member 10 be 60 to 200° C. In cases where the glass transition temperature is less than 60° C., the bonding strength tends to drop and the connection resistance tends to rise at high temperatures. On the other hand, in cases where this glass transition temperature exceeds 200° C., cracking occurs in the circuit connecting-member 10, and the stress at the interface with the first or second circuit member 30 or 40 increases, so that the bonding strength tends to drop.

Concrete examples of the first circuit member 30 and second circuit member 40 include chip parts such as semiconductor chips, resistor chips, capacitor chips and the like, and boards such as printed boards and the like. Large numbers of circuit electrodes (circuit terminals) are ordinarily disposed on these circuit members (in some cases, a single circuit electrode may be disposed). Furthermore, connecting structure configurations that may be used include configurations of connecting structures between IC chips and chip mounting boards, mutual connecting structures of electrical circuits and the like. Especially in cases where the circuit members are IC chips, a sufficient electrical connection can be ensured between the circuit electrodes even if no bumps are formed in the manufacturing process of the connecting structure. Accordingly, a bump formation step can be omitted in the manufacturing process of the connecting structure, so that the manufacturing cost and manufacturing time can be greatly reduced.

[Circuit Member Connecting Structure Manufacturing Method]

Next, the method used to manufacture the abovementioned circuit member connecting structure 200 will be described.

First, the abovementioned first circuit member 30 and second circuit member 40 are prepared.

Figure 4:
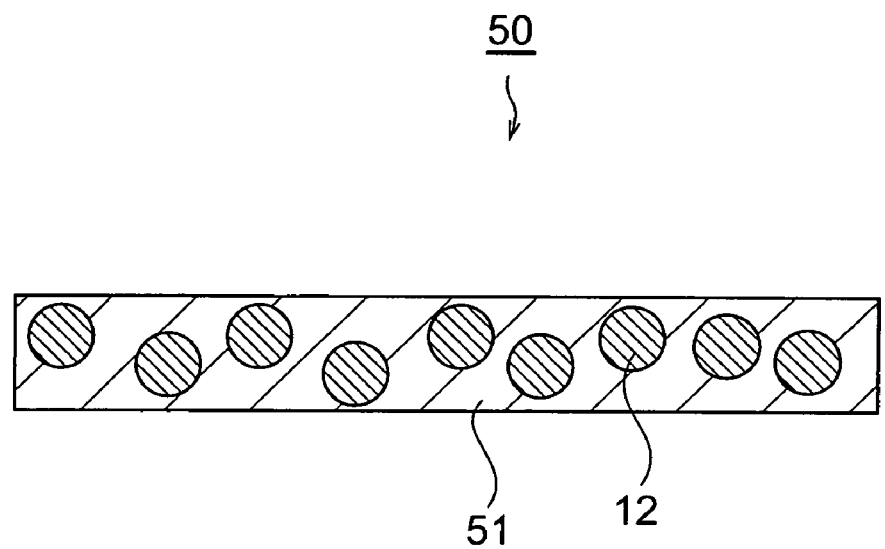
FIG. 4 is a sectional view which shows one embodiment of the film-form circuit connecting material of the present invention.

Meanwhile, a circuit connecting material (hereafter referred to as a "film-form circuit connecting material") 50 which is molded into the form of film is prepared (see FIG. 4). As the film-form circuit connecting material 50, a material is used which contains a bonding agent composition 51 that is cured by a curing treatment applied with respect to the first circuit member 30 and second circuit member 40, and the conductive particles 12, and which exhibits, after the curing treatment, a storage elastic modulus of 0.5 to 3 GPa at 40° C. and a mean coefficient of thermal expansion 30 to 200 ppm/° C. at from 25° C. to 100° C. It is desirable that the thickness of the film-form circuit connecting material 50 be 10 to 50 µm. Furthermore, details regarding this film-form circuit connecting material 50 will be described later.

Next, the film-form circuit connecting material 50 is placed on top of the first circuit member 30. Then, the second circuit member 40 is placed on top of the film-form circuit connecting material 50. In this way, the film-form circuit connecting material 50 can be interposed between the first circuit member 30 and second circuit member 40. In this case, the film-form circuit connecting material 50 has the shape of a film, and is therefore easy to handle. Accordingly, if this film-form circuit connecting material 50 is used, the material 50 can easily be interposed between the first circuit member 30 and second circuit member 40 when these members are connected, so that the work of connecting the first circuit member 30 and second circuit member 40 can easily be accomplished.

Figure 5:
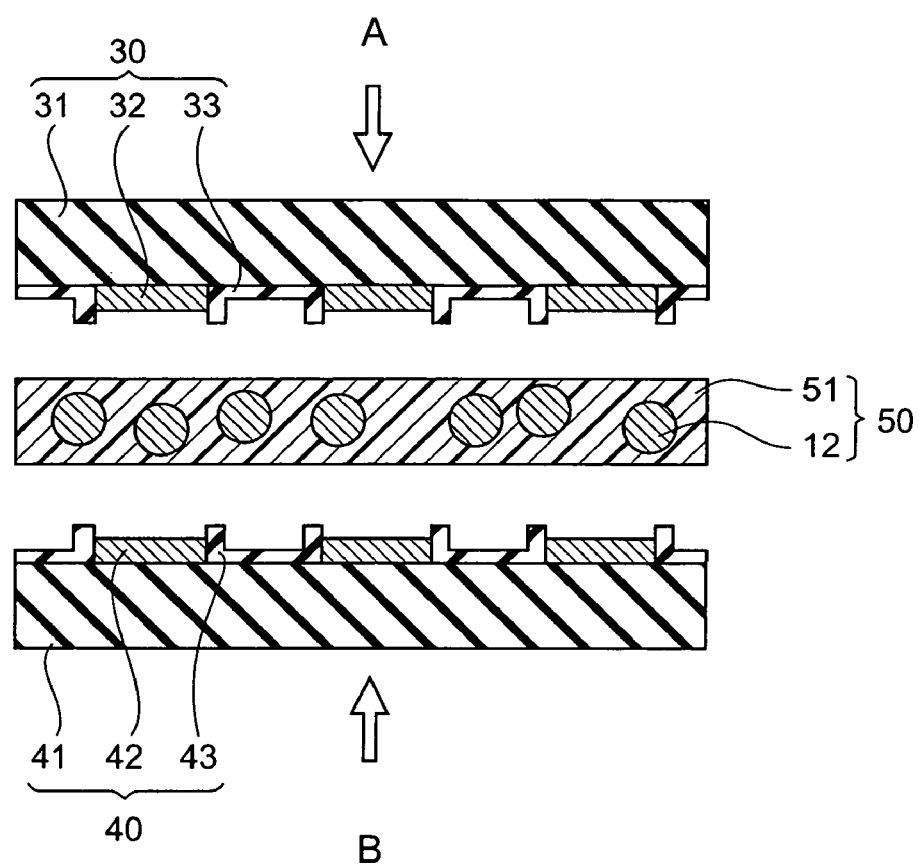
FIG. 5 is a diagram which shows one step of the circuit member connecting structure manufacturing method of the present invention.

Next, a curing treatment is performed (see FIG. 5) by applying heat and pressure in the directions indicated by the arrows A and B in FIG. 5 while heating the film-form circuit connecting material 50 via the first circuit member 30 and second circuit member 40, so that a circuit connecting member 10 is formed between the first and second circuit members 30 and 40 (see FIG. 1). In this case, as a result of the curing treatment, the storage elastic modulus of the circuit connecting member 10 at 40° C. becomes 0.5 to 3 GPa, and the mean coefficient of thermal expansion from 25° C. to 100° C. becomes 30 to 200 ppm/° C. Furthermore, the curing treatment can be performed by a common method; the method used can be appropriately selected in accordance with the bonding agent composition.

When the film-form circuit connecting material 50 is thus interposed between the first circuit member 30 and second circuit member 40, and a curing treatment is performed by pressing while heating the film-form circuit connecting material 50 via the first or second circuit member 30 or 40, even if the conductive particles 12 contained in the film-form circuit connecting material 50 should become caught between the edge parts 43a of the insulating layers 43 and the edge parts 33a of the insulating layers 33 that face each other, these conductive particles 12 are flattened; accordingly, the distance between the circuit electrodes 32 and circuit electrodes 42 can be sufficiently reduced.

Meanwhile, since the film-form circuit connecting material 50 is heated, the bonding agent composition 51 is cured in a state in which the distance between the circuit electrodes 32 and circuit electrodes 42 has been sufficiently reduced, so that the bonding strength with respect to the first circuit member 30 or second circuit member 40 is increased. Thus, the first circuit member 30 and second circuit member 40 are connected via the circuit connecting member 10. Accordingly, the conductive particles 12 can be caused to contact both of the facing circuit electrodes 32 and 42. Specifically, the circuit electrodes 32 and circuit electrodes 42 are electrically connected. Accordingly, in the circuit member connecting structure 200 thus obtained, the connection resistance between the facing circuit electrodes 32 and 42 can be sufficiently reduced.

Furthermore, since the storage elastic module of the circuit connecting member 10 at 40° C. is 0.5 to 3 GPa, and since the mean coefficient of thermal expansion of this member from 25° C. to 100° C. is 30 to 200 ppm/° C., changes over time in the distance between the circuit electrodes 32 and circuit electrodes 42 cause by expansion of the circuit connecting member 10 can be sufficiently reduced even in a high-temperature high-humidity environment. Specifically, even in a high-temperature high-humidity environment, the connection resistance between the facing circuit electrodes 32 and 42 can be sufficiently reduced, so that this structure is superior in terms of the long-term reliability of the electrical characteristics.

Furthermore, in the embodiment as described above, the circuit member connecting structure is manufactured using the film-form circuit connecting material 50; however, a circuit connecting material that will be described later could also be used instead of this film-form circuit connecting material 50. In this case as well, if the circuit connecting material is dissolved in a solvent an the resulting solution is applied to the first circuit member 30 or second circuit member 40 and then dried, this circuit connecting material can be interposed between the first and second circuit members 30 and 40.

[Circuit Connecting Material]

Next, the construction of the abovementioned film-form circuit connecting material 50 will be described in detail.

The film-form circuit connecting material 50 is a material in which a circuit connecting material is molded into the form of a film. This circuit connecting material contains the abovementioned conductive particles 12 and bonding agent composition 51, and is constructed from a material which exhibits, after the curing treatment, a storage elastic modulus of 0.5 to 3 GPa (preferably 0.7 to 2 GPa) at 40° C. and a mean coefficient of thermal expansion of 30 to 200 ppm/° C. at from 25° C. to 100° C.

In the case of a circuit connecting material which exhibits, after the curing treatment, a storage elastic modulus of less than 0.5 GPa at 40° C., the bonding strength is insufficient. On the other hand, in the case of a circuit connecting material whose storage elastic modulus at 40° C. exceeds 3 GPa, after the curing treatment, the connection resistance in the connection areas increases as a result of internal stress, and the bonding agent peels away. Furthermore, in the case of a circuit connecting material which exhibits, after the curing treatment, a mean coefficient of thermal expansion of less than 30 ppm/° C., the bonding strength is insufficient; on the other hand, in the case of a circuit connecting material whose mean coefficient of thermal expansion exceeds 200 ppm/° C. after the curing treatment, the connection resistance in the connection areas increases as a result of internal stress, and the bonding agent peels away.

Furthermore, in the circuit connecting material, it is desirable that the glass transition temperature after the curing treatment is 60 to 200° C., and a glass transition temperature of 60 to 180° C. is even more desirable. In the case of a circuit connecting material which exhibits a glass transition temperature of less than 60° C. after the curing treatment, the bonding strength at high temperatures tends to drop, and the connection resistance tends to rise, in the circuit member connecting structure 200. In the case of a circuit connecting material whose glass transition temperature after the curing treatment exceeds 200° C., curing must be performed at a high temperature and for a long period of time; accordingly, the internal stress in the circuit connecting member 10 is increased, and cracking may occur. Furthermore, since the interfacial stress with the circuit member 30 or 40 is increased, the bonding strength provided by the circuit connecting member 10 tends to drop.

The bonding agent composition contained in the circuit connecting material possesses adhesive properties, and is cured by a curing treatment performed with respect to the first and second circuit members 30 and 40. Furthermore, any bonding agent composition may be used as long as this composition is a composition which exhibits, after the curing treatment, a storage elastic modulus of 0.5 to 3 GPa (preferably 0.7 to 2 GPa) and a mean coefficient of thermal expansion of 30 to 200 ppm/° C. at from 25° C. to 100° C. In particular, compositions containing epoxy resins and epoxy resin latent curing agents are especially desirable.

Examples of the abovementioned epoxy resins include bisphenol A type epoxy resins, bisphenol F type epoxy resins, bisphenol S type epoxy resins, phenol novolak type epoxy resins, cresol novolak type epoxy resins, bisphenol A novolak type epoxy resins, bisphenol F novolak type epoxy resins, alicyclic epoxy resins, glycidyl ester type epoxy resins, glycidylamine type epoxy resins, hydantoin type epoxy resins, isocyanurate type epoxy resins, aliphatic chain-form epoxy resins and the like. These epoxy resins may be halogenated or hydrogenated. Furthermore, two or more of these epoxy resins may be used in combination.

The epoxy resins latent curing agent may be any agent that is capable of curing epoxy resins. Examples of such latent curing agents include anionic polymerizable catalytic curing agents, cationic polymerizable catalytic curing agents, poly-addition type curing agents and the like. These agents may be used singly or in mixtures comprising two or more agents. Among these agents, anionic or cationic polymerizable catalytic curing agents are especially desirable in that such agents are superior in terms of quick curing properties, and do not require consideration of stoichiometric quantities.

Examples of anionic or cationic polymerizable catalytic curing agents include tertiary amines, imidazoles, hydrazide type compounds, boron trifluoride—amine complexes, onium salts (sulfonium salts, ammonium salts and the like), aminoimides, diaminomaleonitrile, melamine and melamine derivatives, polyamine salts, dicyandiamide and the like. Modified forms of these compounds may also be used. Examples of poly-addition type curing agents include polyamines, polymercaptans, polyphenols, acid anhydrides and the like.

In cases where tertiary amines or imidazoles are added as anionic polymerizable catalytic curing agents, the epoxy resin is cured by heating for several tens of seconds to several hours at an intermediate temperature of approximately 160° C. to 200° C. Accordingly, the usable time (pot life) is relatively long, so that such agents are desirable.

Photosensitive onium salts (mainly aromatic diazonium salts, aromatic sulfonium salts and the like are used) that cure epoxy resins by irradiation with an energy beam are desirable as cationic polymerizable catalytic curing agents. Furthermore, aliphatic sulfonium salts and the like are available as agents that cure epoxy resins by being activated by heating other than energy beam irradiation. Curing agents of this type possess the special feature of quick curing properties, and are therefore desirable.

Agents formed by micro-encapsulating the abovementioned curing agents by covering the agents with a polymeric substance such as a polyurethane type polymer, polyester type polymer or the like, a metal thin film of nickel, copper or the like, or an inorganic substance such as calcium silicate or the like, make it possible to extend the usable time, and are therefore desirable.

Furthermore, compositions that contain a radical polymerizable substance and a curing agent that generates free radicals when heated are also desirable for use as the abovementioned bonding agent composition.

The radical polymerizable substance is a substance possessing functional groups that are polymerized by radicals; examples of such radical polymerizable substances include acrylate compounds (including the corresponding methacrylates, same below), maleimide compounds, citraconimide resins, nadimide resins and the like. These radical polymerizable substances may be used in the form of monomers or oligomers; furthermore, monomers and oligomers may be used in combination.

Concrete examples of acrylate compounds include methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(acryloxymethoxy)phenyl]propane, 2,2-bis[4-acryloxypolyethoxy)phenyl]propane, dicyclopentenyl acrylate, tricyclodecanyl acrylate, tris(acryloyloxyethl) isocyanurate, urethane acrylate and the like. These compounds may be used singly or in mixtures containing two or more compounds. If necessary, furthermore, polymerization inhibitors such as hydroquinone, methyletherhydroquinone and the like may also be used. Furthermore, from the standpoint of improving the heat resistance, it is desirable that the acrylate compounds have at least one substituent group selected from a set comprising dicyclopentenyl groups, tricyclodecanyl groups and triazine rings.

Maleimide compounds are compounds that have two or more maleimide groups per molecule; examples of such maleimide compounds include 1-methyl-2,4-bismaleimidobenzine, N,N'-m-phenylenebismaleimide, N,N'-p-phenylenebismaleimide, N,N'-m-toluilenebismaleimide, N,N'-4,4-biphenylenebismaleimide, N,N'-4,4-(3,3'-dimethylbiphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-3,3'-diphenylsulfonebismaleimide, N,N'-4,4-diphenyl ether bismaleimide, 2,2-bis-4-(4-maleimidophenoxy)phenyl)propane, 2,2-bis(3-s-butyl-4,8-(4-maleimidophenoxy)phenyl)propane, 1,1-bis(4-(4-maleimidophenoxy)phenyl)decane, 4,4-cyclohexylidene-bis(1,(4-maleimidophenoxy)-2-cyclohexylbenzene, 2,2-bis(4-(4-maleimidophenoxy)phenyl)hexafluoropropane and the like. These compounds may be used singly or in mixtures containing two or more compounds.

The abovementioned citraconimide resins are resins formed by copolymerizing citraconimide compounds that have at least one citraconimide group per molecule. Examples of citraconimide compounds include phenylcitraconimide, 1-methyl-2,4-biscitraconimidobenzene, N,N'-m-phenylenebiscitraconimide, N,N'-p-phenylenebiscitraconimide, N,N'-4,4-biphenylenebiscitraconimide, N,N'-4,4-(3,3-dimethylbiphenylene)biscitraconimide, N,N'-4,4-(3,3-dimethyldiphenylmethane)biscitraconimide, N,N'-4,4-(3,3-diethyldiphenylmethane)biscitraconimide, N,N'-4,4-diphenylmethanebiscitraconimide, N,N'-4,4-diphenylpropanebiscitraconimide, N,N'-4,4-diphenyl ether biscitraconimide, N,N'-4,4-diphenylsulfonebiscitraconimide, 2,2-bis(4-(4-citraconimidophenoxy)phenyl)propane, 2,2-bis(3-s-butyl-3,4-(4-citraconimidophenoxy)phenyl)propane, 1,1-bis(4-(4-citraconimidophenoxy)phenyl)decane, 4,4'-cyclohexylidene-bis(1-(4-citraconimidophenoxy)phenoxy)-2-cyclohexylbenzene, 2,2-bis(4-(4-citraconimidophenoxy)phenyl)hexafluoropropane and the like. These compounds may be used singly or in mixtures containing two or more compounds.

The abovementioned nadimide resins are resins formed by copolymerizing nadimide compounds that have at least one nadimide group per molecule. Examples of such nadimide compounds include phenylnadimide, 1-methyl-2,4-bisnadimidobenzene, N,N'-m-phenylenebisnadimide, N,N'-p-phenylenebisnadimide, N,N'-4,4-biphenylenebisnadimide, N,N'-4,4-(3,3-dimethylbiphenylene)bisnadimide, N,N'-4,4-(3,3-dimethyldiphenylmethane)bisnadimide, N,N'-4,4-(3,3-diethyldiphenylmethane)bisnadimide, N,N'-4,4-diphenylmethanebisnadimide, N,N'-4,4-diphenylpropanebisnadimide, N,N'-4,4-diphenyl ether bisnadimide, N,N'-4,4-diphenylsulfonebisnadimide, 2,2-bis(4-(4-nadimidophenoxy)phenyl)propane, 2,2-bis(3-s-butyl-3,4-(4-nadimidophenoxy)phenyl)propane, 1,1-bis-4-(4-nadimidophenoxy)phenyl)decane, 4,4'-cyclohexylidene-bis(1-(4-nadimidophenoxy)phenoxy)-2-cyclohexylbenzene, 2,2-bis(4-(4-nadimidophenoxy)phenyl)hexafluoropropane and the like. These compounds may be used singly or in mixtures containing two or more compounds.

If a radical polymerizable substance which has a phosphoric acid ester structure expressed by the following chemical formula (I) is used in combination with the abovementioned radical polymerizable substances, the bonding strength with respect to the surfaces of the circuit electrodes (the constituent material of which is an inorganic substance or the like such as a metal or the like) is improved. Accordingly, the use of such a substance is desirable.

[Formula I]

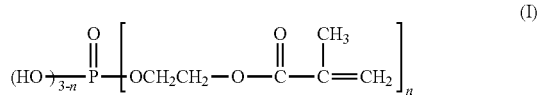

(I)

In the above formula, n indicates an integer of 1 to 3.

Radical polymerizable substances that have a phosphoric acid ester structure can be obtained by reacting phosphoric anhydride and 2-hydroxymethyl (meth)acrylate. Concrete examples of radical polymerizable substances that have a phosphoric acid ester structure include mono(2-methacryloyloxyethyl) acid phosphate, di-(2-methacryloyloxyethyl) acid phosphate and the like. These compounds may be used singly or in mixtures containing two or more compounds.

The amount of the radical polymerizable substance having a phosphoric acid ester structure expressed by the abovementioned chemical formula (I) that is added is preferably 0.01 to 50 parts by weight (and even more preferably 0.5 to 5 parts by weight) per 100 parts by weight of the sum of the radical polymerizable substance and film forming agent (which is added if necessary).

The abovementioned radical polymerizable substances can also be used in combination with allyl acrylate. In this case, the amount of allyl acrylate that is added is preferably 0.1 to 10 parts by weight (and even more preferably 0.5 to 5 parts by weight) per 100 parts by weight of the sum of the radical polymerizable substance and film forming agent (which is added if necessary).

The curing agent that generates free radicals when heated is a curing agent that decomposes and generates free radicals when this agent is heated. Examples of such curing agents include peroxide compounds, azo type compounds and the like. Such curing agents are appropriately selected in accordance with the desired connection temperature, connection time, pot life and the like. Among these compounds, organic peroxides in which the temperature at 10 hours of the half-life period is 40° C. or greater and the temperature at 1 minute of the half-life period is 180° C. or less are desirable, since such peroxides make it possible to increase the reactivity and improve the pot life, and organic peroxides in which the temperature at 10 hours of the half-life period is 60° C. or greater and the temperature at 1 minute of the half-life period is 170° C. or less are even more desirable.

In cases where the connection time is set at 25 seconds or less, it is desirable that the amount of the abovementioned curing agent that is added be 2 to 10 parts by weight (preferably 4 to 8 parts by weight) per 100 parts by weight of the sum of the radical polymerizable substance and film forming agent (which is added if necessary) in order to obtain a sufficient reaction rate. Furthermore, it is desirable that the amount of the curing agent that is added in cases where the connection time is not limited be 0.05 to 20 parts by weight (preferably 0.1 to 10 parts by weight) per 100 parts by weight of the sum of the radical polymerizable substance and film forming agent (which is added if necessary).

In more concrete terms, examples of curing agents that generate free radicals when heated include diacyl peroxides, peroxycarbonates, peroxy esters, peroxyketals, dialkylperoxides, hydroperoxides, silyl peroxides and the like. Furthermore, from the standpoint of suppressing corrosion of the circuit electrodes 32 and 42, it is desirable to use a curing agent in which the concentration of chlorine ions and organic acids contained in the curing agent is 5000 ppm or less; furthermore, a curing agent in which the quantity of organic acids generated following pyrolysis is small is even more desirable. In concrete terms, such curing agents are selected from a set comprising peroxy esters, dialkylperoxides, hydroperoxides and silylperoxides, and selection from peroxy esters that provide a high reactivity is even more desirable. The abovementioned curing agent may be used in appropriate mixtures.

Examples of peroxy esters include cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxypivalate, 1,1,3,3-tetramethylbutyl peroxy-2-ethylhexanoate, 2,5-dimethyl-2,5-di(2-ethylhexanoylperoxy)hexane, 1-cyclhexyl-1-methylethyl peroxy-2-ethylhexanoate, t-hexyl peroxy-2-ethylhexanoate, t-butyl peroxy-2-ethylhexanoate, t-butyl peroxyisobutyrate, 1,1-bis(t-butylperoxy)cyclohexane, t-hexyl peroxyisopropyl monocarbonate, t-butyl peroxy-3,5,5-trimethylhexanoate, t-butyl peroxylaurate, 2,5-dimethyl-2,5-di(m-toluoylperoxy)hexane, t-butyl peroxyisopropyl monocarbonate, t-butyl peroxy-2-ethylhexyl monocarbonate, t-hexyl peroxybenzoate, t-butyl peroxyacetate and the like.

Examples of dialkylperoxides include α,α'-bis(t-butylperoxy)diisopropylbenzene, dicumyl peroxide, 2,5-dimethyl-2,5-di(t-butylperoxy)hexane, t-butylcumyl peroxide and the like.

Examples of hydroperoxides include diisopropylbenzene hydroperoxide, cumene hydroperoxide and the like.

Examples of diacyl peroxides include isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoylperoxytoluene, benzoyl peroxide and the like.

Examples of peroxydicarbonates include di-n-propyl peroxydicarbonate, diusopropyl peroxydicarbonate, bis(4-t-butylcyclohexyl) peroxydicarbonate, di-2-ethoxymethoxy peroxydicarbonate, di(2-ethylhexylperoxy) dicarbonate, dimethoxybutyl peroxydicarbonate, di(3-methyl-3-methoxybutylperoxy) dicarbonate and the like.

Examples of peroxyketals include 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy) decane and the like.

Examples of silyl peroxides include t-butyltrimethylsilyl peroxide, bis(t-butyl)dimethylsilyl peroxide, t-butyltrivinylsilyl peroxide, bis(t-butyl)divinylsilyl peroxide, tris(t-butyl) vinylsilyl peroxide, t-butyltriallylsilyl peroxide, bis(t-butyl) diallylsilyl peroxide, tris(t-butyl)allylsilyl peroxide and the like.

These curing agents may be used singly or in mixtures containing two or more agents. Decomposition accelerating agents, decomposition inhibiting agents and the like may also be mixed with the composition and used. Furthermore, micro-encapsulated agents formed by covering these curing agents with a polyurethane type or polyester type polymeric substance or the like make it possible to extend the usable time, and are therefore desirable.

If necessary, a film forming agent may also be added to the circuit connecting material of the present embodiment. The term "film forming material" refers to a material that facilitates handling of the film and endows the film with mechanical characteristics that prevent the film from easily cracking, splitting or becoming sticky in cases where a liquid substance is solidified so that the constituent composition is formed into a film, thus allowing handling of the composition as a film under ordinary conditions (at ordinary temperature and pressure). Examples of film forming materials include phenoxy resins, polyvinyl formal resins, polystyrene resins, polyvinyl butyral resins, polyester resins, polyamide resins, xylene resins, polyurethane resins and the like. Among these resins, phenoxy resins are especially desirable since such resins are superior in terms of adhesive properties, compatibility, heat resistance, mechanical strength and the like.

Phenoxy resins are resins that are obtained by the reaction of bifunctional phenols and epihalohydrins to a high molecular weight, or by the poly-addition of bifunctional epoxy resins and bifunctional phenol resins. For example, phenoxy resins can be obtained by reacting 1 mole of a bifunctional phenol and 0.985 to 1.015 moles of an epihalohydrin at a temperature of 40 to 120° C. in a non-reactive solvent in the presence of a catalyst such as an alkali metal hydroxide or the like. Furthermore, from the standpoints of the mechanical characteristics and thermal characteristics of the resin, resins that are obtained by setting the mixture ratio of the bifunctional epoxy resin and the bifunctional phenol so that the ratio of epoxy groups to phenolic hydroxy groups is in the range of 1/0.9 to 1/1.1, and causing a poly-addition reaction to proceed by heating the reactants to a temperature of 50 to 200° C. in an organic solvent such as an amide type, ether type, ketone type, lactone type or alcohol type solvent with a boiling point of 120° C. or higher in the presence of a catalyst such as an alkali metal compound, organic phosphorus compound or cyclic amine compound, with the solid content of the reaction system set at 50 parts by weight or less, are especially desirable as phenoxy resins.

Examples of the abovementioned bifunctional epoxy resins include bisphenol A type epoxy resins, bisphenol F type epoxy resins, bisphenol AD type epoxy resins, bisphenol S type epoxy resins, biphenyl glycidyl ether, methyl-substituted biphenyl glycidyl ethers and the like. The abovementioned bifunctional phenols have two phenolic hydroxy groups; examples of such bifunctional phenols include hydroquinones and bisphenols such as bisphenol A, bisphenol F, bisphenol AD, bisphenol S, bisphenol fluorene, methyl-substituted bisphenol fluorene, dihdyroxybiphenyl, methyl-substituted dihydroxybiphenyl and the like. The phenoxy resins may also be modified by radical polymerizable functional groups, epoxy groups or other reactive compounds. These phenoxy resins may be used singly or in mixtures containing two or more resins.

The circuit connecting material of the present embodiment may also contain a polymer or copolymer with at least one monomer selected from a set comprising acrylic acid, acrylic acid esters and acrylonitrile. Here, the combined use of a copolymer type acrylic rubber containing glycidyl acrylate or glycidyl methacrylate which has glycidyl ether groups is desirable, since such rubbers are superior in terms of stress relaxation. From the standpoint of increasing the cohesive strength of the bonding agent, it is desirable that the molecular weight (weight average molecular weight) of such acrylic rubbers be 200,000 or greater.

Furthermore, the circuit connecting material of the present embodiment may also contain minute rubber particles, fillers, softening agents, accelerators, anti-aging agents, coloring agents, flame retarding agents, thixotropic agents, coupling agents, phenol resins, melamine resins, isocyanates and the like.

Such minute rubber particles may be any rubber particles in which the mean particle size of the particles is equal to or less than a size that is twice the mean particle size of the conductive particles 12 that are added, and in which the elastic modulus at room temperature (25° C.) is equal to or less than one-half the room temperature elastic modulus of the conductive particles 12 and bonding agent composition. In particular, the use of minute rubber particles in which the material of the particles is silicone, an acrylic emulsion, SBR, NBR or a polybutadiene rubber (with these materials being used either singly or in mixtures containing two or more materials) is especially suitable. Three-dimensionally crosslinked minute rubber particles of this type are superior in terms of solvent resistance, and can easily be dispersed in the bonding agent composition.

In cases where the circuit connecting material contains a filler, the connection reliability and the like are improved. Accordingly, the inclusion of such a filler is desirable. Any filler may be used, as long as the maximum particle size of this filler is smaller than the particle size of the conductive particles 12. The amount of filler that is mixed is preferably 5 to 60 volume parts per 100 volume parts of the bonding agent composition. If the amount that is mixed exceeds 60 volume parts, the effect in improving the connection reliability tends to become saturated. On the other hand, if this amount is less than 5 volume parts, the effect of adding this filler tends to be insufficient.

Compounds that contain vinyl groups, acrylic groups, epoxy groups or isocyanate groups are desirable as the abovementioned coupling agents, since such compounds improve the adhesive characteristics.

In the abovementioned circuit connecting material, it is desirable that the conductive particles 12 be added at the rate of 0.1 to 30 volume parts per 100 volume parts of the abovementioned bonding agent composition. The amount added may be adjusted according to the application involved. Furthermore, in order to the short-circuiting of adjacent circuit electrodes and the like caused by an excessive amount of conductive particles 12, it is desirable that the amount added be 0.1 to 10 volume parts.

Furthermore, the film-form circuit connecting material 50 can be manufactured by using a coating apparatus (not shown in the figures) to apply the abovementioned circuit connecting material as a coating to the surface of a support (PET (polyethylene terephthalate) film or the like), and then drying the coated support for a specified time by means of a hot air draft.

Figure 6:
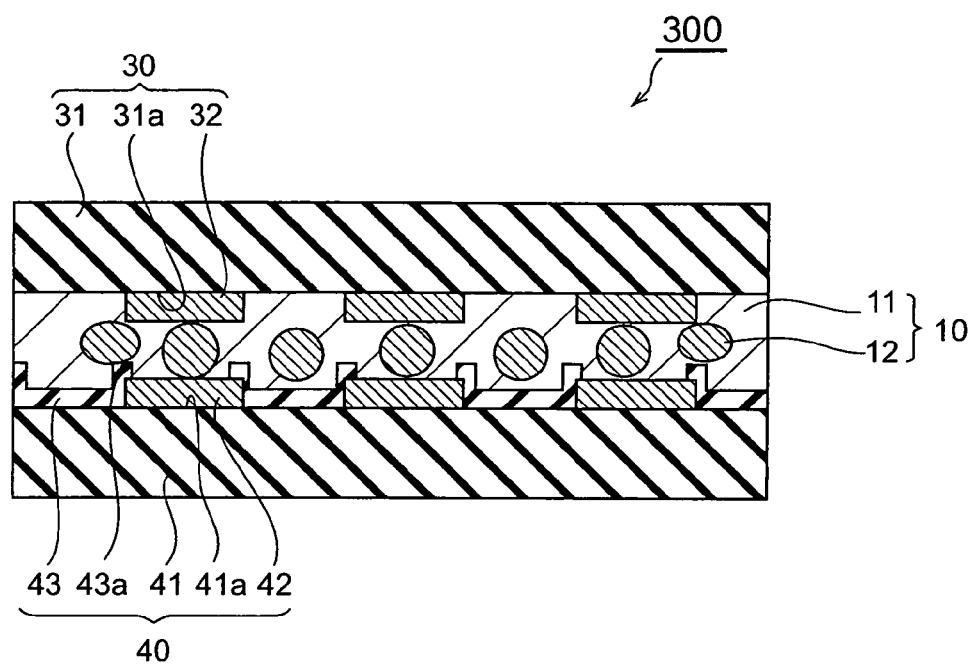
FIG. 6 is a sectional view which shows another embodiment of the circuit member connecting structure of the present invention.
Figure 7:
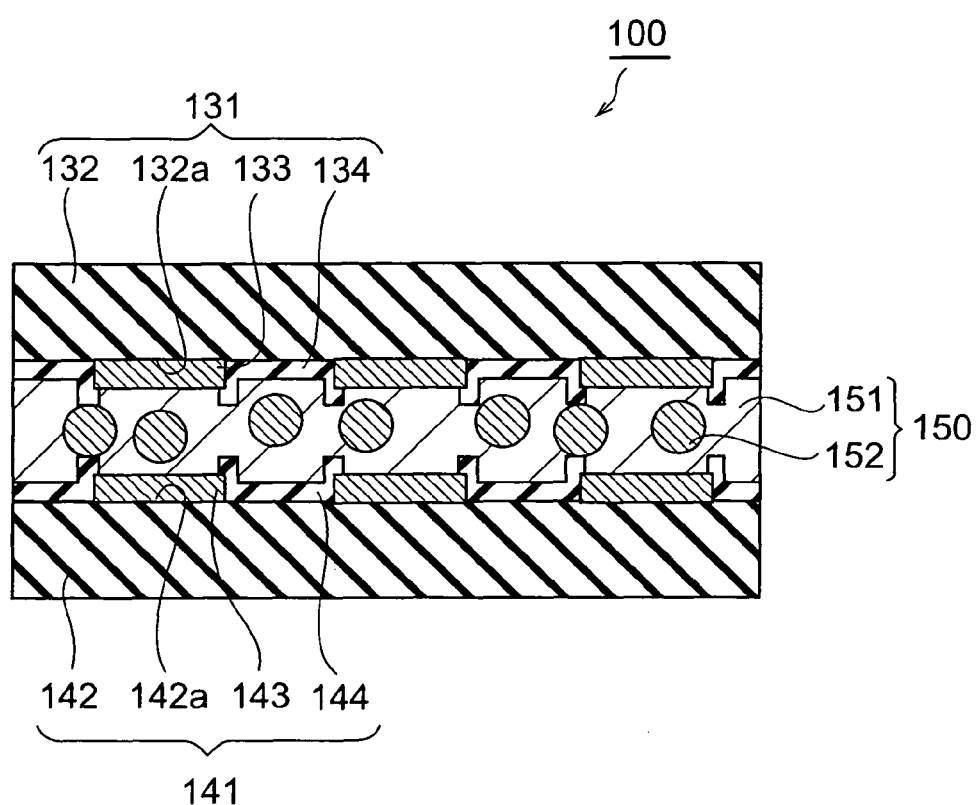
FIG. 7 is sectional view which shows one example of a conventional circuit member connecting structure.

The present invention is not limited to the embodiment described above. For example, in the embodiment described above, the edge parts of the insulating layers are formed with a greater thickness than the circuit electrodes on the basis of the main surfaces of the circuit boards in both the first circuit member and second circuit member. However, it would also be possible, as shown in FIG. 6 for example, to form the edge parts 43a of the insulating layers 43 with a greater thickness than the circuit electrodes 42 only in the second circuit member 40; furthermore, insulating layers need not be formed in the first circuit member 30.

EXAMPLES

The content of the present invention will be described more concretely below in terms of examples. However, the present invention is not limited to these examples.

(Manufacture of Conductive Particles)

The core bodies of conductive particles have the mean particle sizes and hardness values shown in Table 1 and Table 2 were obtained by varying the mixture ratio of tetramethylolmethane tetraacrylate, divinylbenzene and a styrene monomer, performing suspension polymerization using benzoyl peroxide as a polymerization initiator, and classifying the polymers thus obtained.

The respective core bodies thus obtained were plated with an electroless Ni plating or an electroless Ag plating. The desired conductive particles No. 1, 3, 5 through 7 and 10 through 12 were obtained by varying the plating thickness according to the amounts of ingredients in the plating solution and the treatment temperature and time in the plating treatment. Furthermore, the desired conductive particles No. 2, 4, 8, 9, 13 and 14 were obtained by the further substitution plating of Au on conductive particles plated with Ni. Moreover, the desired conductive particles No. 15 through 17 were obtained by the further substitution plating of Pd on conductive particles plated with Ni. The plating thicknesses of the conductive particles thus obtained are also shown in Table 1 and Table 2. Furthermore, in Table 1 and Table 2, the hardness values are expressed in GPa, which are SI units. For reference, however, data in units of kgf/mm² are also shown in parentheses.

TABLE 1

| Conductive particle No. | Mean particle size of core body/μm | Ni plating thickness/nm | Ag plating thickness/nm | Au plating thickness/nm | Hardness of conductive particles/ Gpa(Kgf/mm²) |
|---|---|---|---|---|---|
| 1 | 5 | 100 | — | — | 4.903(500) |
| 2 | 5 | 75 | — | 25 | 4.4413(450) |
| 3 | 5 | — | 80 | — | 5.394(550) |
| 4 | 1 | 75 | — | 25 | 4.903(500) |
| 5 | 5 | 30 | — | — | 4.903(500) |
| 6 | 5 | 100 | — | — | 1.177(120) |
| 7 | 5 | 100 | — | — | 7.845(800) |
| 8 | 5 | 75 | — | 25 | 1.471(150) |
| 9 | 5 | 75 | — | 25 | 7.355(750) |
| 10 | 5 | — | 80 | — | 0.981(100) |
| 11 | 5 | — | 80 | — | 8.336(850) |
| 12 | 1 | 30 | — | — | 5.884(600) |
| 13 | 1 | 75 | — | 25 | 1.177(120) |
| 14 | 1 | 75 | — | 25 | 10.787(1100) |

TABLE 2

| Conductive particle No. | Mean particle size of core body/μm | Ni plating thickness/nm | Pd plating thickness/nm | Hardness of conductive particles/ Gpa(Kgf/mm²) |
|---|---|---|---|---|
| 15 | 5 | 75 | 25 | 4.4413(450) |
| 16 | 5 | 75 | 25 | 0.981(100) |
| 17 | 5 | 75 | 25 | 7.355(750) |

Example 1

50 g of a phenoxy resin (commercial name: PKHC, manufactured by Union Carbide K.K., average molecular weight 45,000) was dissolved in a mixed solvent of toluene/ethyl acetate (=50/50 in terms of weight ratio), thus producing a solution with a solid content of 40 wt %.

Next, 30 g of a phenoxy resin, 30 g of a bisphenol A type epoxy resin and 40 g of Novacure (commercial name 3941HPS, manufactured by Asahi-Ciba K.K.) used as a latent curing agent for the epoxy resin (all amounts here are given in terms of solid content weight ratio) were added to the above-mentioned solution. Furthermore, 5 volume parts of conductive particles No. 1 were further added and dispersed in this solution per 100 volume parts of the bonding agent composition, thus preparing a liquid containing a circuit connecting material. Furthermore, the Novacure 3941HPS of the above-mentioned latent curing agent is a master batch type curing agent in which a micro-encapsulated curing agent with a mean particle size of 5 μm (in which a modified imidazole is used as the core, and the surface of this core is covered by a polyurethane) is dispersed in a liquid-form bisphenol F type epoxy resin.

Next, this liquid containing a circuit connecting material was applied as a coating (by means of a coating apparatus) to a PET film with a thickness of 80 μm that had been subjected to a surface treatment on one side, and this coated film was dried for 10 minutes by a hot air draft at 70° C., thus producing a film-form circuit connecting material with a thickness of 20 μm.

Example 2

The film-form circuit connecting material of Example 2 was obtained in the same manner as in Example 1, except for the fact that conductive particles 2 were used instead of the conductive particles 1 used in Example 1.

Example 3

The film-form circuit connecting material of Example 3 was obtained in the same manner as in Example 1, except for the fact that conductive particles 3 were used instead of the conductive particles 1 used in Example 1.

Example 4

The film-form circuit connecting material of Example 4 was obtained in the same manner as in Example 1, except for the fact that conductive particles 4 were used instead of the conductive particles 1 used in Example 1.

Example 5

The film-form circuit connecting material of Example 5 was obtained in the same manner as in Example 1, except for the fact that 2.5 volume parts of the conductive particles 1 and 2.5 volume parts of the conductive particles 2 were mixed and dispersed instead of the conductive particles 1 used in Example 1.

Example 6

The film-form circuit connecting material of Example 6 was obtained in the same manner as in Example 1, except for the fact that conductive particles 15 were used instead of the conductive particles 1 used in Example 1.

Comparative Example 1

The film-form circuit connecting material of Comparative Example 1 was obtained in the same manner as in Example 1, except for the fact that conductive particles 6 were used instead of the conductive particles 1 used in Example 1.

Comparative Example 2

The film-form circuit connecting material of Comparative Example 2 was obtained in the same manner as in Example 1, except for the fact that conductive particles 6 were used instead of the conductive particles 1 used in Example 1.

Comparative Example 3

A film-form circuit connecting material was obtained in the same manner as in Example 1, except for the fact that conductive particles 8 were used instead of the conductive particles 1 used in Example 1.

Comparative Example 4

A film-form circuit connecting material was obtained in the same manner as in Example 1, except for the fact that conductive particles 9 were used instead of the conductive particles 1 used in Example 1.

Comparative Example 5

A film-form circuit connecting material was obtained in the same manner as in Example 1, except for the fact that conductive particles 10 were used instead of the conductive particles 1 used in Example 1.

Comparative Example 6

A film-form circuit connecting material was obtained in the same manner as in Example 1, except for the fact that conductive particles 11 were used instead of the conductive particles 1 used in Example 1.

Comparative Example 7

A film-form circuit connecting material was obtained in the same manner as in Example 1, except for the fact that conductive particles 13 were used instead of the conductive particles 1 used in Example 1.

Comparative Example 8

A film-form circuit connecting material was obtained in the same manner as in Example 1, except for the fact that conductive particles 14 were used instead of the conductive particles 1 used in Example 1.

Comparative Example 9

A film-form circuit connecting material was obtained in the same manner as in Example 1, except for the fact that conductive particles 16 were used instead of the conductive particles 1 used in Example 1.

Comparative Example 10

A film-form circuit connecting material was obtained in the same manner as in Example 1, except for the fact that conductive particles 17 were used instead of the conductive particles 1 used in Example 1.

Connection Resistance Evaluation Test 1

Preparation of Circuit Members 500 copper circuits (thickness: 8 µm) with a line width of 9 µm and a pitch of 30 µm were formed on a polyimide film (thickness 40 µm), thus producing a flexible circuit board (two-layer FPC) as a first circuit member. Furthermore, a flexible circuit board (three-layer FPC) with a line width of 7 µm and a pitch of 30 µm, which had a three-layer construction comprising a polyimide, a copper foil (thickness 18 µm) and a bonding agent bonding the polyimide and copper foil, was also manufactured as a first circuit member.

Meanwhile, 500 indium-tin oxide (ITO) circuits (thickness 200 nm) with a line width of 15 µm and a pitch of 30 µm were formed on the surface of a glass substrate (thickness 1.1 mm), and silicon nitride was vacuum-deposited between the ITO circuits on this glass substrate, so that insulating layers with a thickness of 600 nm were formed from the centers of the ITO circuits, thus producing a second circuit member.

(Connection of Circuit Members)

First, the bonding surfaces of the film-form circuit connecting materials (width 1 mm) of Examples 1 through 6 and Comparative Examples 1 through 10 were pasted onto the surface of the second circuit member. Then, heat and pressure were applied for 5 seconds at 70° C. and 0.5 MPa, so that the film-form circuit connecting materials were temporarily connected to the second circuit member, and the PET film was peeled away. Subsequently, the two-layer FPC constituting the first circuit member was disposed so that each film-form circuit connecting material was interposed between this two-layer FPC and the second circuit member. Then, the film-form circuit connecting material was subjected to heating and pressing for 10 seconds at 180° C. and 3 MPa via the first circuit member and second circuit member. In this way, a circuit member connecting structure was obtained. Furthermore, the connection of the second circuit member and the three-layer FPC constituting the first circuit member was also performed in the same manner as described above, thus producing a circuit member connecting structure.

(Measurement of Connection Resistance)

The resistance values of the circuits were measured by multi-meter, both initially (immediately after connection) and after the circuits were held for 1000 hours in a high-temperature high-humidity tank at 80° C. and 95% RH (high-temperature high-humidity treatment), for the abovementioned circuit member connecting structures. The results are shown in Table 3. Furthermore, in Table 3, the resistance values are indicated as the sum of the mean value for 150 resistance points between adjacent circuits and a value that is three times the standard deviation (x+3σ).

(Counting of Conductive Particles Present on Circuit Electrodes)

Following the connection of the circuit members, the numbers of conductive particles that were present on the respective circuit electrodes in the abovementioned connecting structures were counted by visual inspection using a microscope. The numbers of conductive particles on the circuit electrodes are indicated as the mean numbers of conductive particles present on 151 electrodes. The results are shown in Table 3.

(Storage Elastic Modulus and Mean Coefficient of Thermal Expansion of Circuit Connecting Members)

It was confirmed that the storage elastic modulus at 40° C. following the curing treatment was in the range of 0.5 to 0.3 GPa, and that the mean coefficient of thermal expansion was in the range of 30 to 200 ppm/° C., in the film-form circuit connecting materials of Examples 1 through 6 and Comparative Examples 1 through 10.

tions in the distance between the facing circuit electrodes caused by the high-temperature high-humidity treatment; as a result, there was a rise in the connection resistance following the high-temperature high-humidity treatment.

Furthermore, in the case of the circuit member connecting structures using the film-form circuit connecting materials of Comparative Examples 2, 4, 6, 8 and 10, it appears that the initial connection resistance was high due to the fact that the conductive particles used were too hard, so that sufficient flattening of the conductive particles could not be obtained, and that there was a rise in the connection resistance following the high-temperature high-humidity treatment due to the

TABLE 3

| Film-form circuit connecting material | Connecting structure using two-layer FPC | | | Connecting structure using three-layer FPC | | |
|---|---|---|---|---|---|---|
| | Connection resistance (initial)/Ω | Connection resistance (after high-temperature high-humidity treatment)/Ω | Number of conductive particles on connected electrodes (number) | Connection resistance (initial)/Ω | Connection resistance (after high-temperature high-humidity treatment)/Ω | Number of conductive particles on connected electrodes (number) |
| Example 1 | 1.2 | 2 | 8 | 2.16 | 2.8 | 8 |
| Example 2 | 0.96 | 1.52 | 7 | 1.28 | 1.92 | 7 |
| Example 3 | 1.12 | 1.6 | 7 | 1.6 | 2.16 | 7 |
| Example 4 | 0.56 | 0.8 | 16 | 0.64 | 0.88 | 16 |
| Example 5 | 1.12 | 1.76 | 20 | 1.6 | 2.32 | 20 |
| Example 6 | 1.28 | 1.84 | 8 | 2.08 | 2.64 | 8 |
| Comparative Example 1 | 2.0 | >10 | 6 | 2.7 | >10 | 6 |
| Comparative Example 2 | 4.2 | >10 | 8 | 6.0 | >10 | 8 |
| Comparative Example 3 | 1.8 | >10 | 7 | 2.6 | >10 | 7 |
| Comparative Example 4 | 3.8 | >10 | 6 | 5.4 | >10 | 6 |
| Comparative Example 5 | 1.8 | >10 | 8 | 2.6 | >10 | 8 |
| Comparative Example 6 | 4.0 | >10 | 9 | 5.8 | >10 | 9 |
| Comparative Example 7 | 1.875 | >10 | 23 | 2.75 | >10 | 23 |
| Comparative Example 8 | 3.75 | >10 | 23 | 5.75 | >10 | 23 |
| Comparative Example 9 | 7.5 | >10 | 8 | >10 | >10 | 8 |
| Comparative Example 10 | 3.75 | >10 | 7 | 7.5 | >10 | 7 |

It was confirmed from the results shown in Table 3 that the circuit member connecting structures using the film-form circuit connecting materials of Examples 1 through 6 all showed a good connection resistance initially, regardless of whether the first circuit member as a two-layer FPC or three-layer FPC, and that there was likewise almost no rise in the connection resistance following the high-temperature high-humidity treatment.

On the other hand, in the circuit member connecting structures using the film-form circuit connecting materials of Comparative Examples 1 through 10, the initial connection resistance values were high, and in particular, the rise in the connection resistance following the high-temperature high-humidity treatment was conspicuous. The reason for this is thought to be as follows: namely, in the case of the circuit member connecting structures using the film-form circuit connecting materials of Comparative Examples 1, 3, 5, 7 and 9, the hardness of the conductive particles used was too soft, so that the conductive particles could not follow the fluctuafact that the conductive particles could not follow the fluctuations in the distance between the facing circuit electrodes caused by the high-temperature high-humidity treatment.

Connection Resistance Evaluation Test 2

Preparation of Circuit Members

In an IC chip on which 40 gold bumps with a bump area of 100 μm×100 μm, a pitch of 200 μm and a height of 20 μm were disposed, silicon nitride was vacuum-deposited in the areas between the bumps, thus forming insulating layers with a thickness of 600 nm from the centers of the bumps, so that a first circuit member was produced.

Furthermore, circuits with a thickness of 200 nm were formed by indium-tin oxide (ITO) on a glass substrate (thickness 1.1 mm). Then, silicon nitride was vacuum-deposited between the ITO circuits on this glass substrate, so that insulating layers with a thickness of 600 nm were formed from the centers of the ITO circuits, thus producing a second circuit member.

(Connection of Circuit Members)

Circuit member connecting structures were produced by connecting the first circuit member and second circuit member in the same manner as in Evaluation Test 1, except for the fact that the abovementioned IC chip was used as the first circuit member instead of a two-layer FPC or three-layer FPC.

(Measurement of Connection Resistance)

The connection resistance was measured by the same method as in Evaluation Test 1, both in the initial stage following the connection of the circuit members, and after the test samples were subjected to a high-temperature high-humidity treatment, for the connecting structures obtained as described above. The results are shown in Table 4. Furthermore, in Table 4, the resistance values are indicated as the sum of the mean value for 150 resistance points between adjacent circuits and a value that is three times the standard deviation (x+3σ).

(Counting of Conductive Particles Present on Circuit Electrodes)

Following the connection of the circuit members, the numbers of conductive particles that were present on the respective circuit electrodes in the abovementioned connecting structures were counted by the same method as in Evaluation Test 1. The numbers of conductive particles on the circuit electrodes are indicated as the mean numbers of conductive particles present on 40 electrodes. The results are shown in Table 4.

TABLE 4

| Film-form circuit connecting material | Connection resistance (initial)/ mΩ | Connection resistance (after high-temperature high-humidity treatment)/Ω | Number of conductive particles on connected electrodes (number) |
|---|---|---|---|
| Example 1 | 1 | 0.4 | 5 |
| Example 2 | 3 | 0.2 | 4 |
| Example 3 | 2 | 0.5 | 7 |
| Example 4 | 4 | 0.3 | 10 |
| Example 5 | 6 | 0.3 | 13 |
| Example 6 | 3 | 0.4 | 6 |
| Comparative Example 1 | 800 | >3 | 5 |
| Comparative Example 2 | 1400 | >3 | 6 |
| Comparative Example 3 | 600 | >3 | 7 |
| Comparative Example 4 | 700 | >3 | 9 |
| Comparative Example 5 | 1500 | >3 | 6 |
| Comparative Example 6 | 2000 | >3 | 7 |
| Comparative Example 7 | 1300 | >3 | 15 |
| Comparative Example 8 | 900 | >3 | 15 |
| Comparative Example 9 | 1200 | >3 | 8 |
| Comparative Example 10 | 900 | >3 | 6 |

The circuit member connecting structures using the film-form circuit connecting materials of Examples 1 through 6 all showed a good connection resistance in the initial stage even in cases where the abovementioned IC chip was used as the first circuit member instead of the two-layer FPC or three-layer FPC using in Evaluation Test 1. Likewise, it was confirmed that there was almost no rise in the connection resistance following the high-temperature high-humidity treatment.

On the other hand, as in the case of Evaluation Test 1, the circuit member connecting structures using the film-form circuit connecting materials of Comparative Examples 1 through 10 showed a high connection resistance in the initial stage, and showed an especially conspicuous rise in the connection resistance following the high-temperature high-humidity treatment.

As was described above, the use of the circuit connecting material, circuit member connecting structure and circuit member connecting structure manufacturing method of the present invention makes it possible to achieve a sufficient reduction in the connection resistance between facing circuit electrodes when facing circuit members are connected to each other.

Furthermore, if the film-form circuit connecting material of the present invention is used, the following effect is obtained in addition to the abovementioned effects: namely, this film-form circuit connecting material can easily be interposed between the first circuit member and second circuit member when these circuit members are connected, so that the work of connecting the first circuit member and second circuit member can easily be performed.

The invention claimed is:

1. A method for manufacturing a circuit member connecting structure which comprises a first circuit member in which first circuit electrodes are located on the main surface of a first circuit board, a second circuit member in which second circuit electrodes are located on the main surface of a second circuit board, and a circuit connecting member which is disposed between the main surface of said first circuit member and the main surface of said second circuit member for connecting said first and second circuit members to each other, wherein insulating layers of silicon dioxide or silicon nitride are located adjacent to both of said first circuit electrodes and said second circuit electrodes, at least some of said insulating layers being formed so that these layers are thicker than said circuit electrodes on the basis of the main surface of the circuit board in both of said first and second circuit members, said method comprising the steps of:
  interposing a film-form circuit connecting material between the main surface of said first circuit board and the main surface of said second circuit board, and
  curing said circuit connecting material by the application of heat and pressure via said first and second circuit members for thereby connecting said first circuit member and said second circuit member, so that said first circuit electrodes and said second circuit electrodes are electrically connected via said conductive particles,
  wherein the film-form circuit connecting material is formed by forming a circuit connecting material into a shape of a film;
  wherein the circuit connecting material has a property that the material can electrically connect a first circuit member in which first circuit electrodes are located on the main surface of a first circuit board, and a second circuit member in which second circuit electrodes are located on the main surface of a second circuit board, when insulating layers of silicon dioxide or silicon nitride are located adjacent to at least one of said first circuit electrodes and said second circuit electrodes, with at least some of said insulating layers being formed such that these layers are thicker than said circuit electrodes on the basis of said main surface in at least one of said first and second circuit members;

wherein said material contains a bonding agent composition and conductive particles which have a mean particle size of 1 μm or greater but less than 10 μm, and a hardness of 4.4413 to 6.865 GPa; and wherein said material exhibits, when subjected to a curing treatment, a storage elastic modulus of 0.5 to 3 GPa at 40° C., and a mean coefficient of thermal expansion of 30 to 200 ppm/° C. at from 25° C. to 100° C.

2. The method for manufacturing a circuit member connecting structure according to claim 1, wherein a difference in thickness between the insulating layer adjacent the first circuit electrodes and the first circuit electrodes is 50 to 600 nm, and a difference in thickness between the insulating layer adjacent the second circuit electrodes and the second circuit electrodes is 50 to 600 nm.

3. The method for manufacturing a circuit member connecting structure according to claim 1, wherein said film-form circuit connecting material interposed between the main surfaces of the first and second circuit boards has a thickness of 10 to 50 μm.

4. The method for manufacturing a circuit member connecting structure according to claim 1, wherein said conductive particles comprise a core body made of an organic polymer, and a metal layer made of copper, nickel, a nickel alloy, silver or a silver alloy which is formed on the surface of said core body, and the thickness of said metal layer is 50 to 170 nm.

5. The method for manufacturing a circuit member connecting structure according to claim 1, wherein said conductive particles comprise an outermost layer made of gold or palladium, and the thickness of said outermost layer is 15 to 70 nm.

6. The method for manufacturing a circuit member connecting structure according to claim 1, wherein said bonding agent composition contains an epoxy resin and a latent curing agent for said epoxy resin.

7. The method for manufacturing a circuit member connecting structure according to claim 1, wherein said bonding agent composition contains a radical-polymerizable substance, and a curing agent which generates free radicals when heated.

8. The method for manufacturing a circuit member connecting structure according to claim 1, wherein the circuit connecting material has a glass transition temperature of 60 to 200° C. after the curing treatment.

9. The method for manufacturing a circuit member connecting structure according to claim 1, wherein the circuit connecting material further contains a film forming material.

10. The method for manufacturing a circuit member connecting structure according to claim 9, wherein said film forming material is a phenoxy resin.

11. The method for manufacturing a circuit member connecting structure according to claim 8, wherein said glass transition temperature is 60 to 180° C. after the curing treatment.

12. The method for manufacturing a circuit member connecting structure according to claim 1, wherein said storage elastic modulus is 0.7 to 2 GPa.

13. The method for manufacturing a circuit member connecting structure according to claim 1, wherein said circuit connecting material has said property when said insulating layers are located adjacent to both of said first and second circuit electrodes, with at least some of said insulating layers being formed such that these layers are thicker than said first and second circuit electrodes on the basis of said main surface in both of said first and second circuit members.

* * * * *